United States Patent [19]

Welch et al.

[11] Patent Number: 4,478,701
[45] Date of Patent: Oct. 23, 1984

[54] TARGET SUPPORT ADJUSTING FIXTURE

[75] Inventors: Patrick G. Welch, Indianapolis; Everett E. Mitchell, Plainfield, both of Ind.

[73] Assignee: RCA Corporation, New York, N.Y.

[21] Appl. No.: 567,189

[22] Filed: Dec. 30, 1983

[51] Int. Cl.³ .............................................. C23C 15/00
[52] U.S. Cl. ................................ 204/298; 204/192 R
[58] Field of Search ........................... 204/298, 192 R

[56] References Cited

U.S. PATENT DOCUMENTS

| | | | |
|---|---|---|---|
| 3,707,452 | 12/1972 | Lester et al. | 204/192 R |
| 4,014,779 | 3/1977 | Kuehnle | 204/298 |
| 4,204,936 | 3/1980 | Hartsough | 204/192 R |
| 4,308,126 | 12/1981 | Wright | 204/298 |
| 4,309,266 | 1/1982 | Nakamura et al. | 204/298 |
| 4,340,462 | 7/1982 | Kock | 204/298 |
| 4,353,777 | 10/1982 | Jacob | 204/298 |

Primary Examiner—Arthur P. Demers
Attorney, Agent, or Firm—Birgit E. Morris; Donald S. Cohen; James M. Trygg

[57] ABSTRACT

A sputtering apparatus for the deposition of thin films of material upon substrates is disclosed having an improved target mounting mechanism. The improved mounting mechanism provides the capability to easily raise and lower the target with respect to the substrate while maintaining critical alignment of the vacuum seal components. Additionally, capability is provided to easily adjust the angular position of the target with respect to the substrate being coated.

8 Claims, 6 Drawing Figures

TARGET SUPPORT ADJUSTING FIXTURE

The present invention relates to RF or D.C. sputtering apparatus for the deposition of thin films on substrates. More particularly, the present invention relates to a target support adjusting fixture in a sputtering apparatus.

BACKGROUND OF THE INVENTION

Sputtering systems are extensively used in the electronic industry for depositing thin films of material upon substrates. These systems frequently include an evacuable chamber, a cathode assembly, an anode which can simply be the inside walls of the chamber, and a target attached to the cathode assembly. In operation, a substrate to be coated is placed within the chamber opposite the target. The chamber is exacuated to a low pressure and a suitable gas is introduced throughout the chamber. A suitable power supply is then utilized to apply an R.F. or D.C. potential between the cathode and anode thereby generating ions that accelerate toward the cathode assembly striking the target with sufficient energy to cause the target to partially vaporize. The vaporized target material diffuses throughout the chamber and deposits in the form of a thin film on the substrate.

Occasionally, it is necessary to raise or lower the target with respect to the substrate or to rotate the target to a particular angular position to achieve a desired effect. Prior art target support mechanisms have sometimes included several vertically disposed threaded studs arranged in a circle, each having an adjusting nut threaded thereon. A ring member, from which the target is suspended, has clearance holes formed therein to correspond to the position of the studs. The ring member is arranged with its under surface resting on the adjusting nuts and the studs projecting through the clearance holes. With this arrangement, the adjusting nuts are turned in one direction or the other a given number of turns to cause the ring member and thereby the target to raise or lower as desired. To properly effect this adjustment each nut in seriatim must be turned a small but equal amount until all of the nuts are in their new postions. This procedure is quite time consuming. Further, a problem may arise should one of the nuts be turned too far with respect to the other nuts. Generally, the target is disposed within the vacuum chamber and the target support mechanism is disposed outside of the vacuum chamber, with a cylindrical shaped collar being provided as a feed through. The target is attached to one end of the collar and the ring member to the other end of the collar. The outside diameter of the collar being very smooth passes through an "O" ring vacuum seal associated with the vacuum chamber. With this type of structure turning one of the adjusting nuts too far with respect to the others causes the target and support collar to tilt somewhat resulting in scratches or nicks occurring in the smooth outer surface of the support collar. Needless to say that such scratches and nicks will destroy the vacuum sealing capability of the device. What is desired is the capability to assure that all adjusting nuts are turned an equal amount when adjustment is made to the height of the target.

SUMMARY OF THE INVENTION

According to the present invention a sputtering apparatus for depositing thin films of material upon a substrate is provided. The apparatus includes a vacuum chamber having a vertical axis and a wall separating the chamber from the ambient atmosphere. A target is arranged in alignment with the vertical axis of the chamber. A target support collar projects through the wall and is in vacuum sealing engagement therewith. One end of the collar is attached to the target within the vacuum chamber. A mounting means is attached to the wall and to the other end of the collar outside of the chamber for supporting the weight of the target and holding it in operating position within the chamber. The vertical height of the target and its angular position with respect to the vertical axis of the chamber are selectively adjustble while automatically and continuously maintaining the target in alignment with the vertical axis.

BRIEF DESCRIPTION OF THE DRAWINGS

With reference to FIGS. 1, 2, and 3 there is shown a sputtering apparatus 10 having a top 12, bottom 14, and enclosing side walls 16 which define a vacuum chamber 20. A substrate holder 22 for holding a substrate 24 to be coated is suitably arranged within the chamber 20. Suitable openings 26 are provided in the side walls 16 to provide access to the interior so that substrates may be placed within the chamber for depostion thereon or finished substrates removed. Cover plates 28 are removably attached to the side walls 16 so that the openings 26 are completely covered as shown in FIGS. 1 and 2. Suitable "O" rings 30 are provided to form a vacuum seal between the cover plates 28 and the side walls 16.

Figure 1:
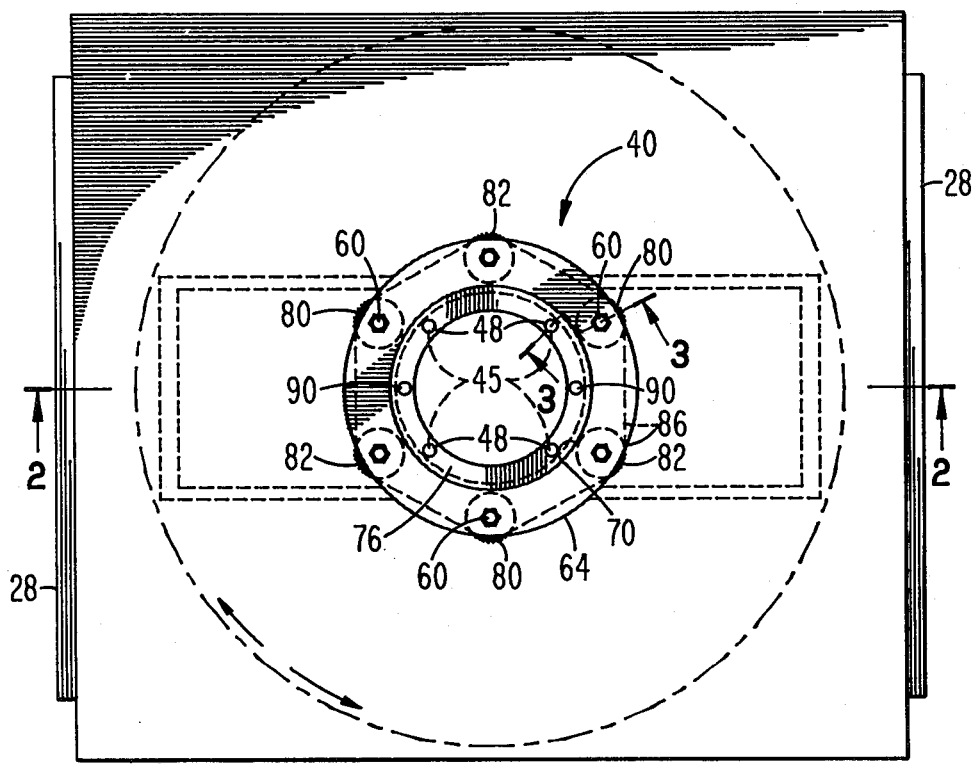
FIG. 1 is a top view of a sputtering apparatus embodying the teachings of the present invention.
Figure 2:
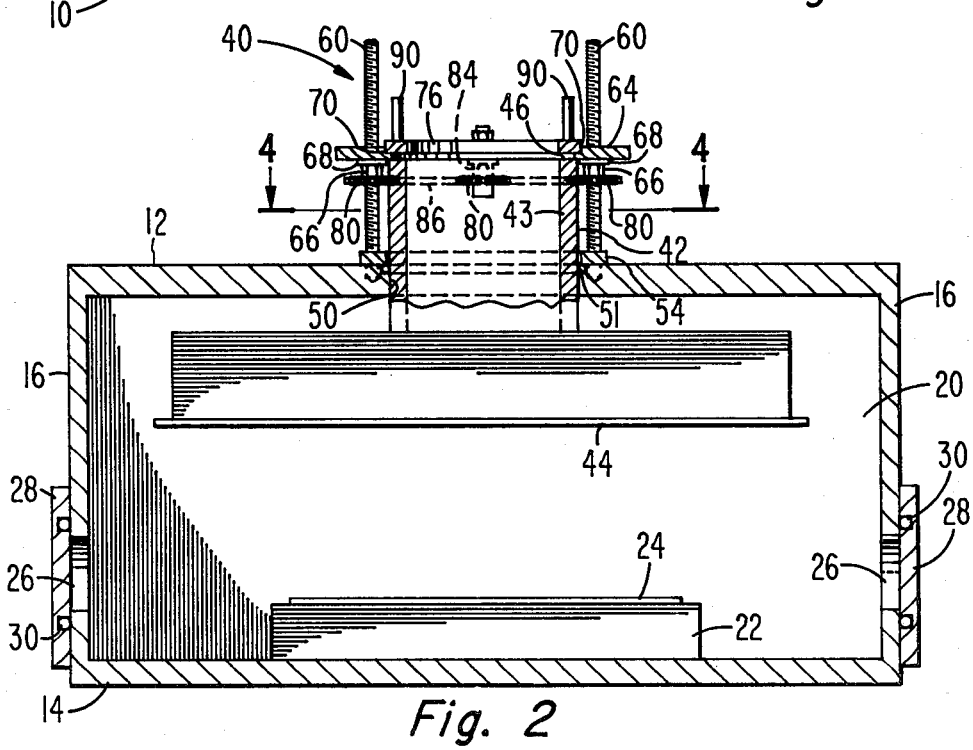
FIG. 2 is a partial section view taken along the line 2—2 as shown in FIG. 1.
Figure 3:
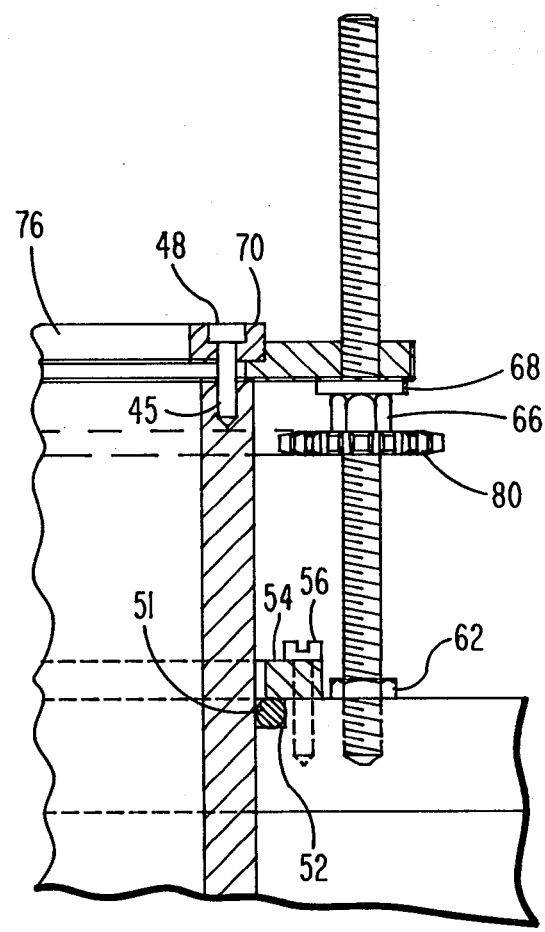
FIG. 3 is an enlarged partial section view taken along the line 3—3 as shown in FIG. 1.

A target mounting mechanism 40 is arranged on the top 12 as shown in FIGS. 1 and 2. A cylindrically shaped hollow target support collar 42, one end of which is rigidly attached to a target 44, has its upwardly facing end 46 removably attached to the target mounting mechanism 40 in a manner that will be described below. Four equally spaced threaded holes 45 are formed in the end 46 and will contain mating screws 48 for a purpose to be described below. A central hole 50 is bored through the top 12 and a counterbore 52 formed in the upper surface thereof, as best seen in FIG. 3. The hole 50 is of slightly larger diameter than the outside diameter of the target support collar 42 so that the collar 42 may be disposed within the hole 50 without contacting the walls of the hole 50. An "O" ring 51 is provided within the counterbore 52 and held in place by a clamping ring 54. The "O" ring 51, being deformed somewhat by the clamping ring 54, presses against the outside diameter of the collar 42 thereby centering it within the hole 50 and providing a vacuum seal between the collar 42 and the top 12. The clamping ring 54 is firmly attached to the top 12 with a plurality of spaced apart screw fasteners 56, as shown in FIG. 4.

Figure 4:
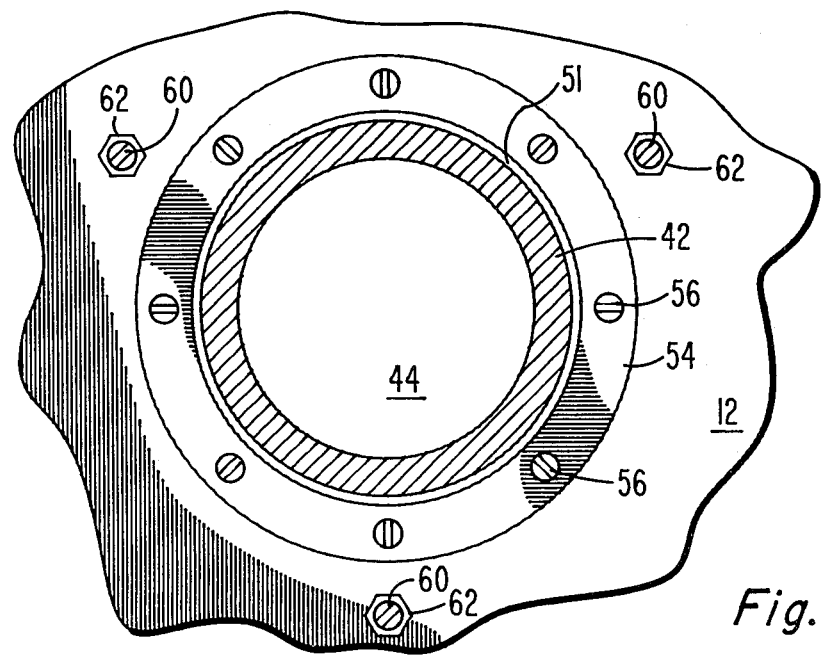
FIG. 4 is a partial section view taken along the line 4—4 as shown in FIG. 2.

Three threaded studs 60 are arranged equally spaced about the collar 42 as shown in FIGS. 1, 2, and 4. The studs having one end threaded into three blind holes formed in the top 12, project upwardly, as viewed in FIG. 2, and are substantially mutually parallel. Locking nuts 62, shown in FIGS. 3 and 4, secure the three studs 60 to the top 12. A support ring 64 having three clearance holes formed therein spaced to receive the three studs 60, is arranged as shown in FIGS. 1 and 2. Three adjusting nuts 66 are threaded onto the studs 60, one nut to each stud, providing vertical supports upon which the support ring 64 rests. Flat thrust washers 68 are provided between the adjusting nuts and the under surface 70 of the support ring 64.

A chain drive sprocket 80 is welded or formed integral to each of the adjusting nuts 66, as shown in FIG. 2. Three idler sprockets 82 are rotationally attached, by suitable means, to the support ring 64 as shown. As best seen in FIG. 2, the idler sprockets 82 have associated therewith a hub or spacer 84 that positions the idler sprockets coplanar with the drive sprockets 80. A continuous sprocket chain 86 is disposed about the sprockets 80 and 82 in operational engagement therewith. With this arrangement, when one of the adjusting nuts 66 is turned, the action of the chain 86 on the drive sprockets 80 cause the other adjusting nuts to turn a like amount in the same direction.

The support ring 64 has a central bore having a diameter substantially smaller than the outside diameter of the collar 42 and at the same time being sufficiently large to clear the screws 48 when assembled in the threaded holes 45, as is best seen in FIG. 3. A counterbore 70 is formed in the top surface 72 of the support ring 64 concentric with the central bore thereof. A locking ring 76 having an outside diameter slightly smaller than the diameter of the counterbore 70 is disposed therewithin as shown in FIG. 2. Four clearance holes for the screws 48 are formed through the locking ring 76 in alignment with the threaded holes 45. The screws 48, when tightly threaded into the holes 45 firmly clamp the support ring 64 between the locking ring 76 and the end 46 of the collar 42, thus forming a rigid assembly. When the screws 48 are loosened, the locking ring 76 and collar 42 are free to rotate together while the support ring 64 remains stationary. A pair of pins 90 are attached to the locking ring 76 as shown in FIGS. 1 and 2, and serve as handles which may be manipulated to rotate the locking ring, collar 42, and target 44.

Figure 5:
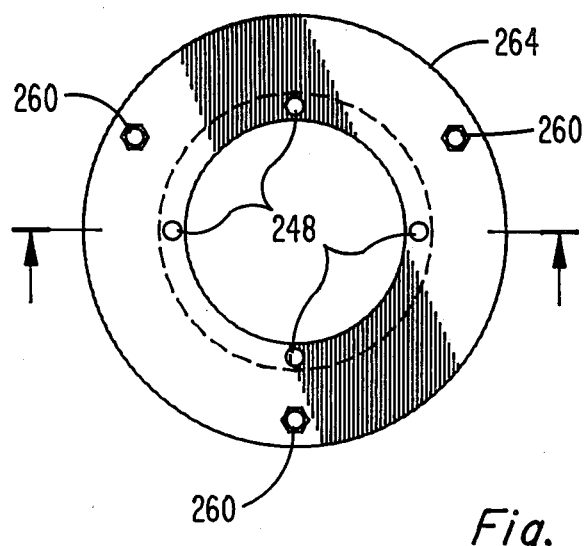
FIGS. 5 and 6 are similar to FIGS. 1 and 2 but showing a prior art structure.
Figure 6:
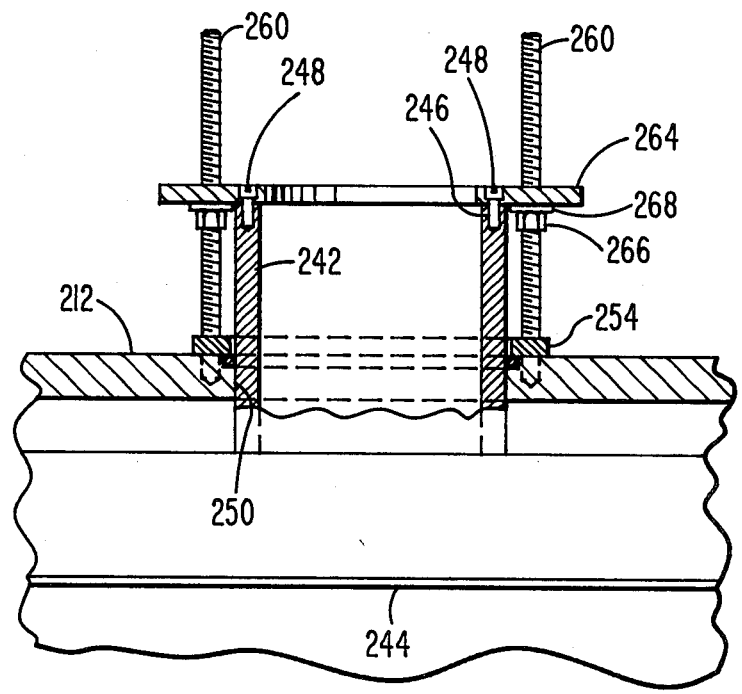

A prior art structure dipicting a target mounting mechanism is shown in FIGS. 5 and 6. Parts that are similar to those described for the present invention are given similar identifying numbers prefixed with a "2". There, a collar 242 is shown attached to a target 244. The collar 242 projects upwardly through an opening 250 formed in the top 212. A support ring 264 is rigidly attached to the end 246 of the collar 242 by the screws 248 which are counterbored into the support ring. Three threaded studs 260 are threaded into the top 212 as shown in FIGS. 5 and 6, through clearance holes formed in the support ring 264. Though adjusting nuts 266 are provided, one on each stud 260. Thrust washers 268 are interposed the support ring 264 and the adjusting nuts 266.

With this arrangement, there is no provision for angular adjustment of the target. Further, when it is desired to adjust the height of the target with respect to the substrate being coated, each adjusting nut 266 must be turned individually a small amount at a time so that the collar 242 will remain in alignment with the opening 250. This can be a time consuming and tedious process if the desired adjustment in height of the target is relatively large. If the collar 242 is permitted to become significantly out of alignment, scratches or nicks may occur in the smooth vacuum sealing outer surface of the collar.

The important advantages achieved by employing the teachings of the present invention are (1) the capability to easily and quickly raise and lower the target with respect to the substrate being coated without damaging the vacuum sealing outer surface of the collar, and (2) the capability to easily rotate the target about a vertical axis and secure the target in a desired position.

We claim:

1. A sputtering apparatus for depositing thin films of material upon a substrate, said apparatus having:
   (a) a vacuum chamber having a vertical axis;
   (b) a wall separating said chamber from the ambient atmosphere;
   (c) a target arranged in alignment with said vertical axis of said chamber;
   (d) a target support collar projecting through said wall and being in vacuum sealing engagement therewith, said collar having one end attached to said target within said chamber; and
   (e) mounting means attached to said wall and to the other end of said collar outside of said chamber for supporting the weight of said target and holding said target in operating position within said chamber so that the vertical height and angular position with respect to said vertical axis of said chamber are selectively adjustable while automatically and continuously maintaining said target in alignment with said vertical axis.

2. The apparatus set forth in claim 1 wherein said mounting means comprises a support ring having a substantially flat surface arranged orthogonal to said vertical axis of said chamber a plurality of threaded rods arranged parallel to said vertical axis, one end of each rod being rigidly attached to said frame and the other end of each rod projecting upwardly toward said support ring a plurality of adjustable nuts threadingly engaged with said threaded rods so that each said rod has one adjustable nut threaded thereon in abutting contact with said flat surface of said support ring, and means for adjusting said plurality of adjustable nuts in unison whereby when said vertical height of said support ring is selectively adjusted said target remains in alignment with said vertical axis.

3. The apparatus set forth in claim 2 wherein said other end of each threaded rod projects through an opening formed in said support ring.

4. The apparatus set forth in claim 3 wherein said means adjusting said plurality of adjustable nuts comprises a plurality of sprocket wheels, one wheel being attached to each adjustable nut, and a chain arranged in operational engagement with each of said plurality of sprocket wheels so that said chain may be selectively manipulated to impart rotational motion to each of said plurality of adjustable nuts in unison and in a common direction.

5. The apparatus set forth in claim 4 wherein there are three of said threaded rods and said means for adjusting said plurality of adjustable nuts includes three idler sprocket wheels arranged on a common bolt circle with said threaded rods, said three idler sprocket wheels being in operational engagement with said chain.

6. The apparatus set forth in claim 5 wherein (a) said support ring includes a central bore therethrough and a counterbore aligned with said vertical axis of said chamber opposite said flat surface, and (b) wherein said mounting means further comprises a locking ring arranged to rotationally engage said counterbore and attaching means for releasably and selectively attaching said locking ring and said target support collar to said support ring.

7. The apparatus set forth in claim 6 wherein said attaching means comprises a plurality of spaced apart clearance holes formed through said locking ring parallel to said vertical axis of said target, a plurality of threaded holes formed in said target support collar in registery with said holes of said locking ring, and a plurality of screw fasteners arranged in engagement with said clearance holes and said threaded holes so that said support ring is firmly clamped between said locking ring and said target support collar thereby forming a rigid assembly, said clearance holes and said threaded holes being arranged so that said screw fasteners are apart from said central bore of said support ring.

8. The apparatus set forth in claim 7 wherein said locking ring includes a pin attached thereto for serving as a handle which may be manipulated to rotate said locking ring within said counterbore of said support ring.

* * * * *